United States Patent
Yuan

(10) Patent No.: US 7,551,497 B2
(45) Date of Patent: Jun. 23, 2009

(54) MEMORY CIRCUITS PREVENTING FALSE PROGRAMMING

(75) Inventor: Jao Che Yuan, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 7 days.

(21) Appl. No.: 11/869,196

(22) Filed: Oct. 9, 2007

(65) Prior Publication Data

US 2008/0068910 A1  Mar. 20, 2008

(30) Foreign Application Priority Data

Sep. 20, 2007 (TW) .............................. 96135125 A

(51) Int. Cl.
*G11C 7/00* (2006.01)
(52) U.S. Cl. .................... 365/189.11; 365/195; 365/226
(58) Field of Classification Search ........................ None
See application file for complete search history.

(56) References Cited

U.S. PATENT DOCUMENTS 5,257,239 A * 10/1993 Guo et al. .............. 365/230.06
5,446,408 A * 8/1995 Tedrow et al. .............. 327/530
5,615,162 A * 3/1997 Houston ...................... 365/226
5,828,607 A * 10/1998 Bushey et al. .......... 365/189.11
6,166,981 A    12/2000 Kirihata et al.

\* cited by examiner

*Primary Examiner*—Tan T. Nguyen
(74) *Attorney, Agent, or Firm*—Thomas, Kayden, Horstemeyer & Risley

(57) ABSTRACT

Memory circuits capable of preventing false programming caused by power-up sequence are provided, in which a programmable unit comprises a plurality of programmable elements, a source bus coupled between an external programming voltage and the programmable elements, a switching unit connected between the external programming voltage and the source bus, comprising a control terminal, and a level shifter, shifting a voltage level of an enabling signal to a first power voltage from a second power voltage lower than the external programming voltage. When the second power voltage is not ready during power up, the level shifter sets the control terminal of the switching unit to a predetermined logic level such that the switching unit is turned off and the source bus is disconnected from the external programming voltage thereby preventing false programming.

19 Claims, 14 Drawing Sheets

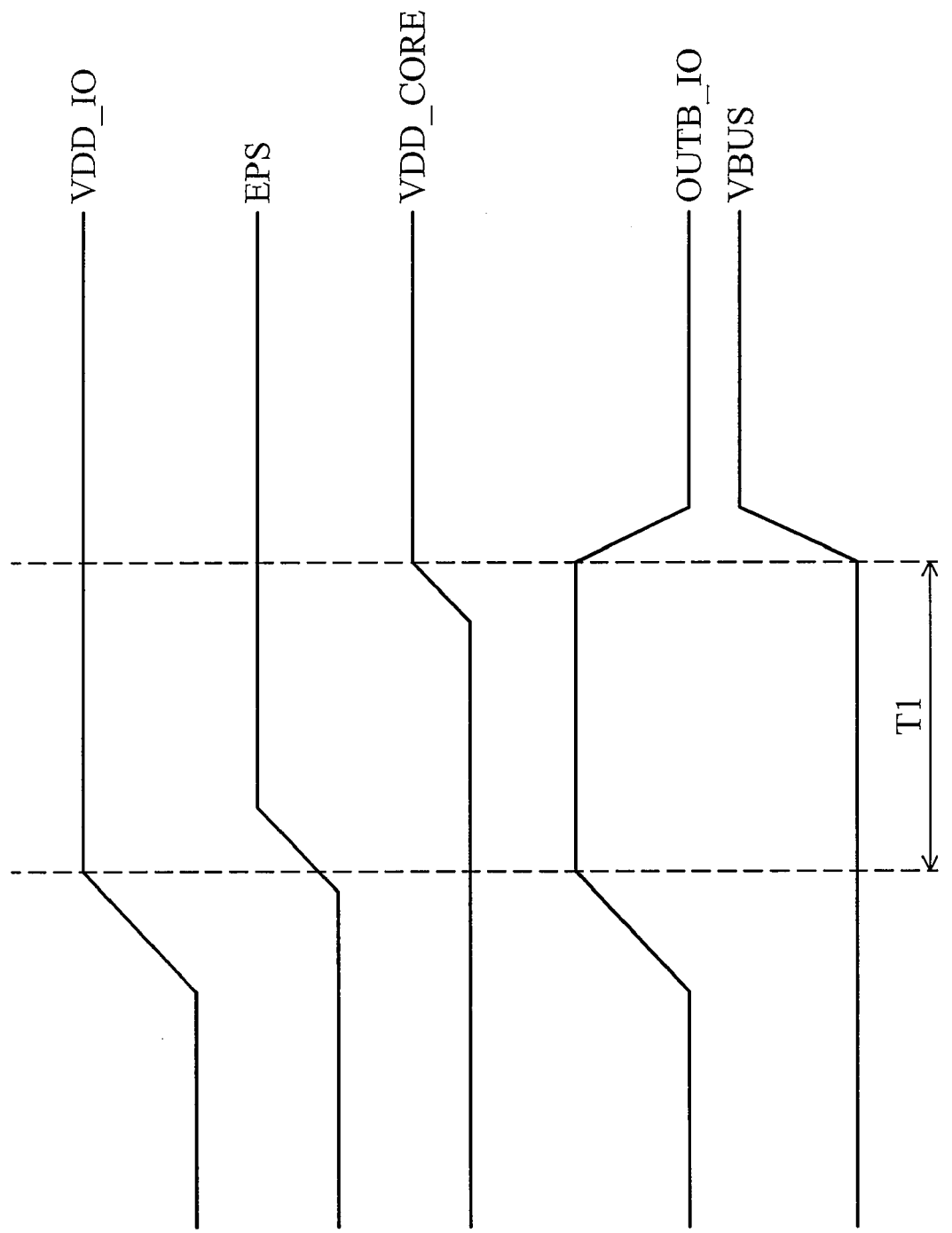

US 7,551,497 B2

MEMORY CIRCUITS PREVENTING FALSE PROGRAMMING

BACKGROUND OF THE INVENTION

1. Field of the Invention

The invention relates to a memory circuit, and in particular to a memory circuit capable of preventing false programming caused by power-up sequence.

2. Description of the Related Art

Fuse elements are widely used in semiconductor devices to record chip ID or serial number. In general, each fuse element includes a fuse capable of being selectively blown (i.e., opened or severed) in order to disconnect the fuse element from the remainder of the semiconductor circuit. For example, the fuse can be irradiated by a laser until it is opened, or opened by an electrical overcurrent capable of dissipating sufficient heat. Unlike using the laser, blowing the fuse by the electrical overcurrent can be performed even after the semiconductor device has been packaged and is referred as to "electrically programming" the fuse element. The fuse susceptible to such programming is referred to as an "electrically programmable fuse" or simply "e-fuse", and most fuses can only be programmed once to provide 0 or 1 states corresponding to high or low resistance states or vice versa.

BRIEF SUMMARY OF THE INVENTION

A detailed description is given in the following embodiments with reference to the accompanying drawings.

Embodiments of memory circuits are provided, in which a programmable unit comprises a plurality of programmable elements, a source bus coupled between an external programming voltage and the programmable elements, a switching unit coupled between the external programming voltage and the source bus, comprising a control terminal, and a level shifter, shifting a voltage level of an enabling signal to a first power voltage from a second power voltage lower than the external programming voltage. When the second power voltage is not ready during power up, the level shifter sets the control terminal of the switching unit to a predetermined logic level such that the switching unit is turned off and the source bus is disconnected from the external programming voltage thereby preventing false programming.

The invention provides another embodiment of a memory circuit in which a power supply provides an external programming voltage, and a programmable unit, comprising a plurality of programmable elements coupled to a source bust and a programming circuit programming the programmable elements. The programming circuit comprises a plurality of drivers coupled to the programmable elements and a first level shifter powered by at least a first power voltage lower than the external programming voltage. The first level shifter sets a first predetermined logic level to an output terminal thereof such that the drivers in the programming circuit are disabled when the first power voltage is not ready during power up, such that the level shifter prevents false programming.

The invention provides embodiments of malfunction protection methods for a memory circuit, in which the memory circuit comprises a plurality of programmable elements, a programming circuit and a sensing circuit. In the method, a switching unit is disposed between the programmable elements and an external programming voltage, a first level shifter is disposed to couple to an control terminal of the switching unit. The first level shifter is powered by first and second power voltages, the second power voltage is lower than the external programming voltage and the first power voltage exceeds the external programming voltage. The control terminal of the switching unit is set to a first predetermined logic level such that the switching unit is turned off and the programmable elements are disconnected from the external programming voltage when the second power voltage is not ready during power-up.

BRIEF DESCRIPTION OF THE DRAWINGS

The invention can be more fully understood by reading the subsequent detailed description and examples with references made to the accompanying drawings, wherein:

FIG. 8 shows a simulation of the memory circuit shown in FIG. 5.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
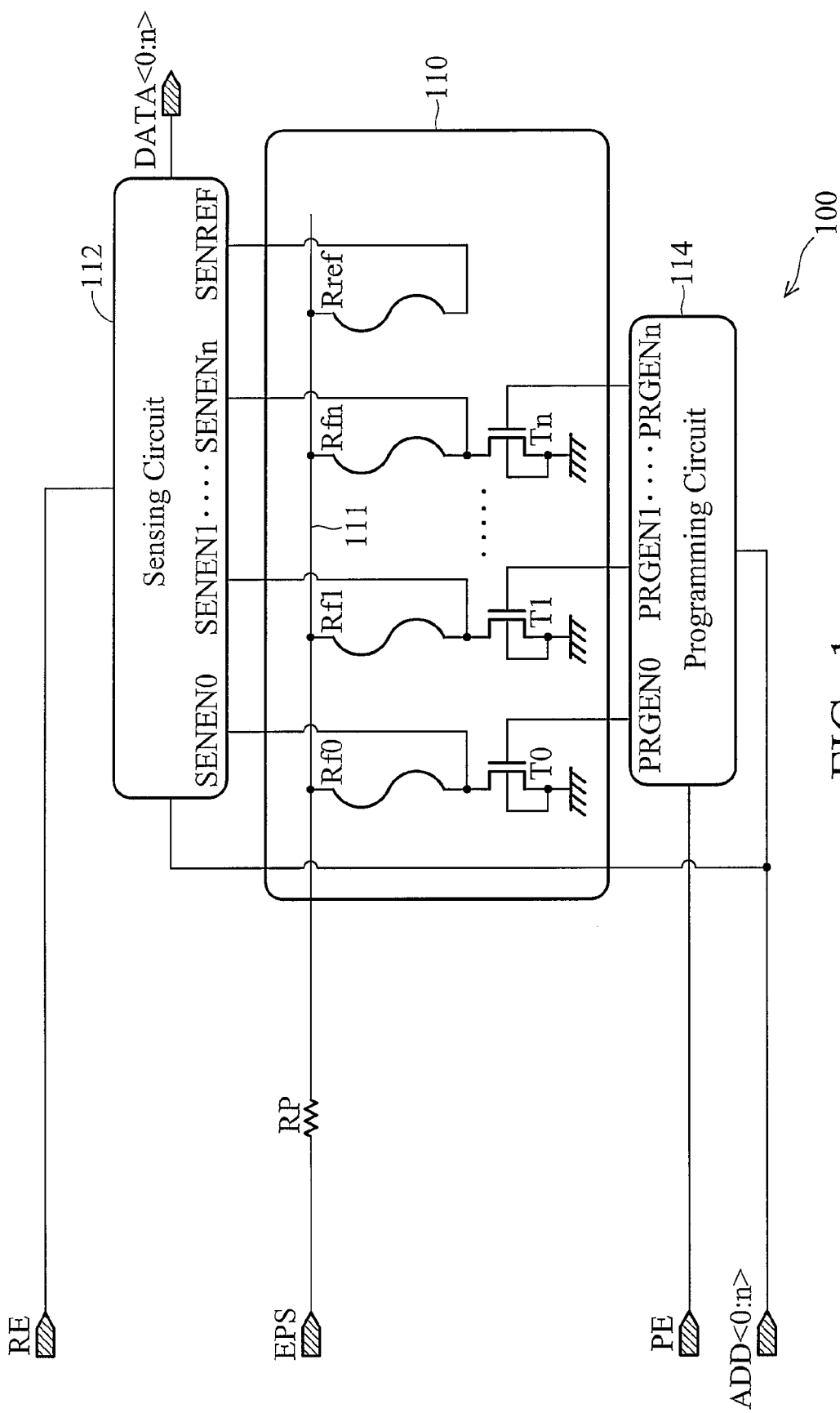
FIG. 1 shows an embodiment of a memory circuit.

FIG. 1 shows an embodiment of a memory circuit. As shown, the memory circuit 100 comprises an electrical programmable unit 110, such as an e-fuse bank, a sensing circuit 112 and a programming circuit 114. The electrical programmable unit 110 comprises a plurality of fuse elements each comprising a fuse (i.e. Rf0, Rf1 or Rfn) to be blown and a NMOS transistor (i.e. T0, T1 or Tn) serving as a current source. The fuses Rf0~Rfn can be salicide polysilicon resistors, and the MOS transistors T0~Tn can be thick or thin gate devices. A reference fuse Rref is also connected to the sensing circuit 112, to differentiate the non-blown or blown fuse. The sensing circuit 112 incorporates address ADD<0:n> to be detected and a read enabling signal RE to activate read operations and output compared data DATA<0:n>.

The programming circuit 114 incorporates address ADD<0:n> to be programmed and a programming enabling signal PE to program corresponding fuses in the electrical programmable unit 110. The fuses Rf0~Rfn and Rref are connected to an external programming voltage EPS, such as a fuse source or a power voltage, through a source bus 111 and a resistor RP. Since stable and steady current is necessary during programming, the resistance value in the current path from the external programming voltage EPS to the source bus 111 should be kept to be as low as possible. As the current sources (i.e. NMOS transistors T0~Tn) are implemented by high voltage I/O devices (i.e. thick gate devices), multiple power supply and level shifters capable of shifting core power domain signals to I/O power domain signals may be necessary for the sensing circuit 112 and the programming circuit 114.

Figure 2:
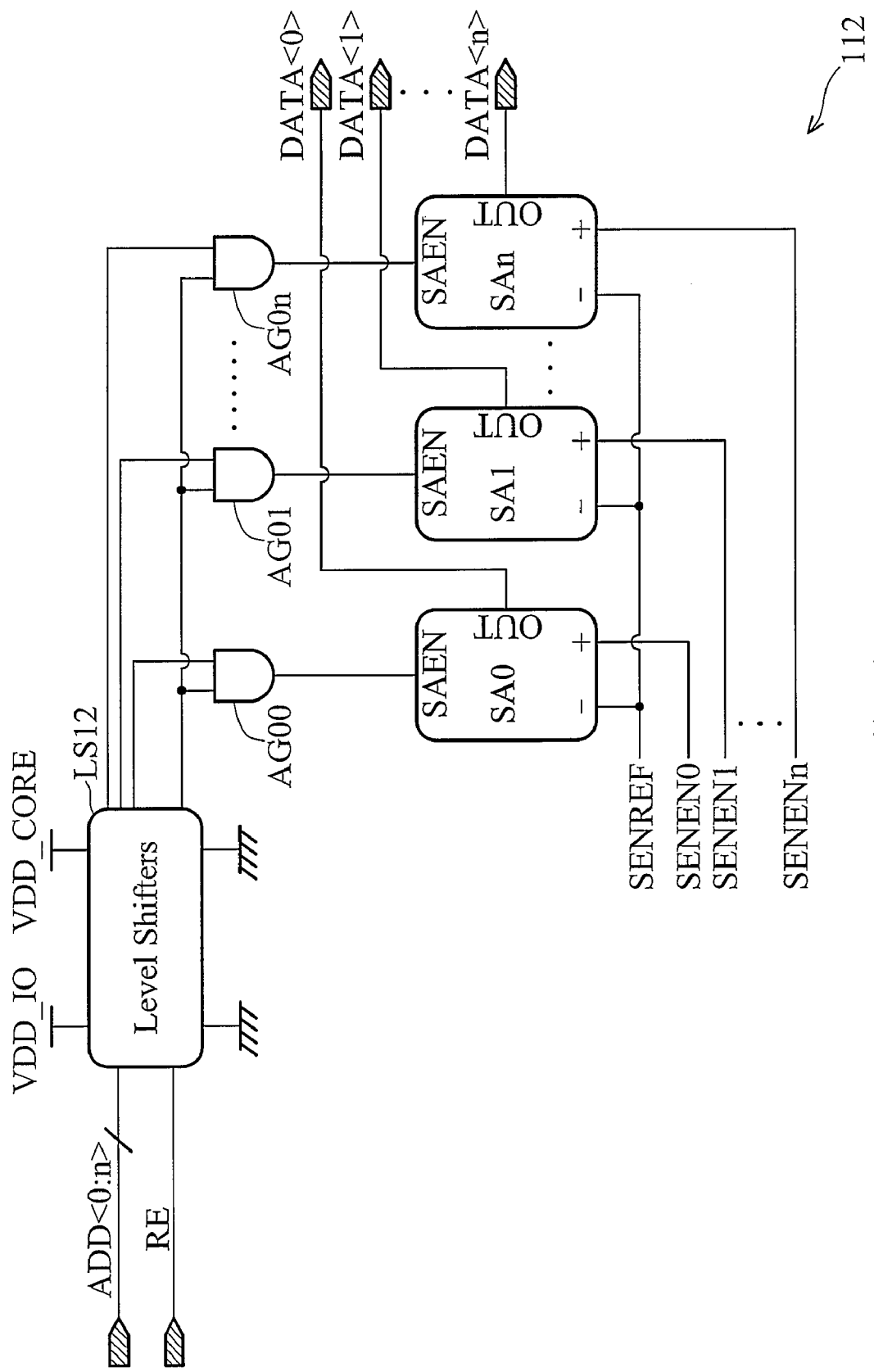
FIG. 2 shows an embodiment of a sensing circuit.

FIG. 2 shows an embodiment of a sensing circuit. As shown, the sensing circuit 112 comprises level shifters LS12, AND gates AG00~AG0n, sensors SA0~SAn. The level shifters LS12 are coupled to a core power voltage VDD_CORE and a I/O power voltage VDD_IO, shifting the address ADD<0:n> to be detected and the read enabling signal RE to be I/O power domain signals from core power domain signals. The sensors SA0~SAn each connect to a corresponding fuse and the reference fuse Rref. The AND gates AG00~AG0n drive the sensors SA0~SAn thereby outputting compared data, according to address ADD<0:n>.

Figure 3:
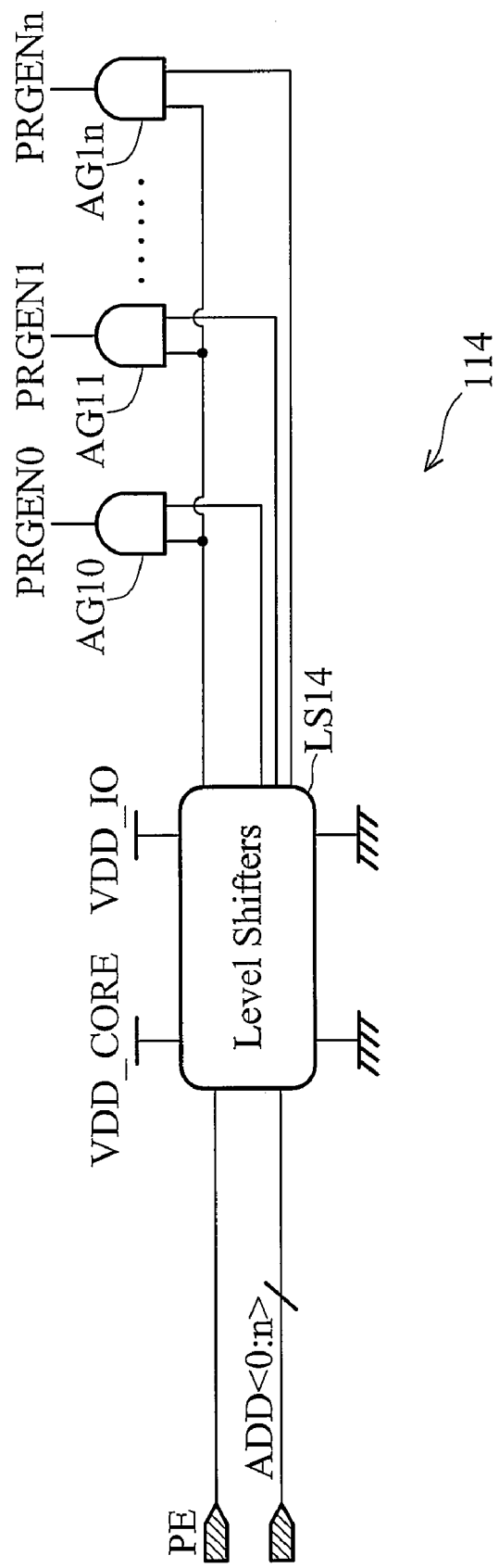
FIG. 3 shows an embodiment of a programming circuit.

FIG. 3 shows an embodiment of a programming circuit. As shown, the programming circuit 114 comprises level shifters LS14, and AND gates AG10~AG1n. The level shifters LS14 are also coupled to the core power voltage VDD_CORE and the I/O power voltage VDD_IO, shifting the address ADD<0:n> to be programmed and the programming enabling signal PE to I/O power domain signals from core power domain signals. The AND gates AG10~AG1n serve as drivers and each connects to a corresponding fuse. When receiving as the programming enabling signal PE from the level shifters LS14, the AND gates AG10~AG1n program (i.e. blow) the fuses according to the address ADD<0:n>.

Figure 4:
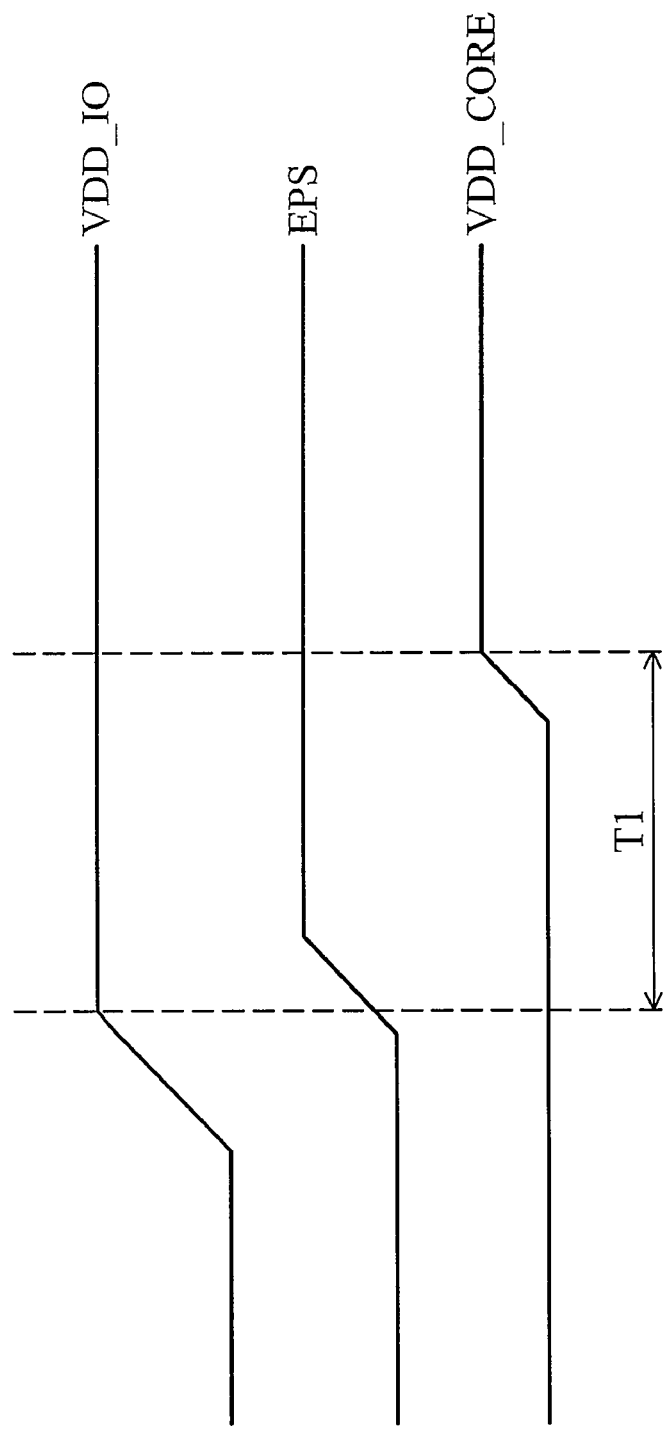
FIG. 4 shows a simulation of the memory circuit shown in FIG. 1

However, if cascaded regulators are used, it is possible to have a power supply power-on sequence as shown in FIG. 4, during power-up. For example, the I/O power voltage VDD_IO, such as 3.3V, precedes the external programming voltage EPS, such as 2.5V, and the core power voltage VDD_CORE, such as 1.0V. Hence, when the I/O power voltage VDD_IO is ready and the core power voltage VDD_CORE is not available (i.e., not ready), the external programming voltage EPS can be any value such that the electrical programmable unit 110 is at an unknown state during the period T1. This situation can potentially cause unexpected or false programming.

In some embodiments, the NMOS transistors (i.e. T0~Tn) in the programmable unit 110 can be implemented by thin gate devices, and thus, only the core power voltage VDD_CORE is needed for the sensing circuit 112 and the programming circuit 114 and the level shifters thereof can be omitted. However, it is still required to maintain the power up sequence of the external programming source EPS and the core power voltage VDD_CORE, such that the core power voltage VDD_CORE must be ready prior to the external programming voltage EPS to avoid unexpected or false programming.

To prevent this situation, the invention further provides embodiments of a memory circuit capable of preventing false programming caused by power up sequence.

Figure 5:
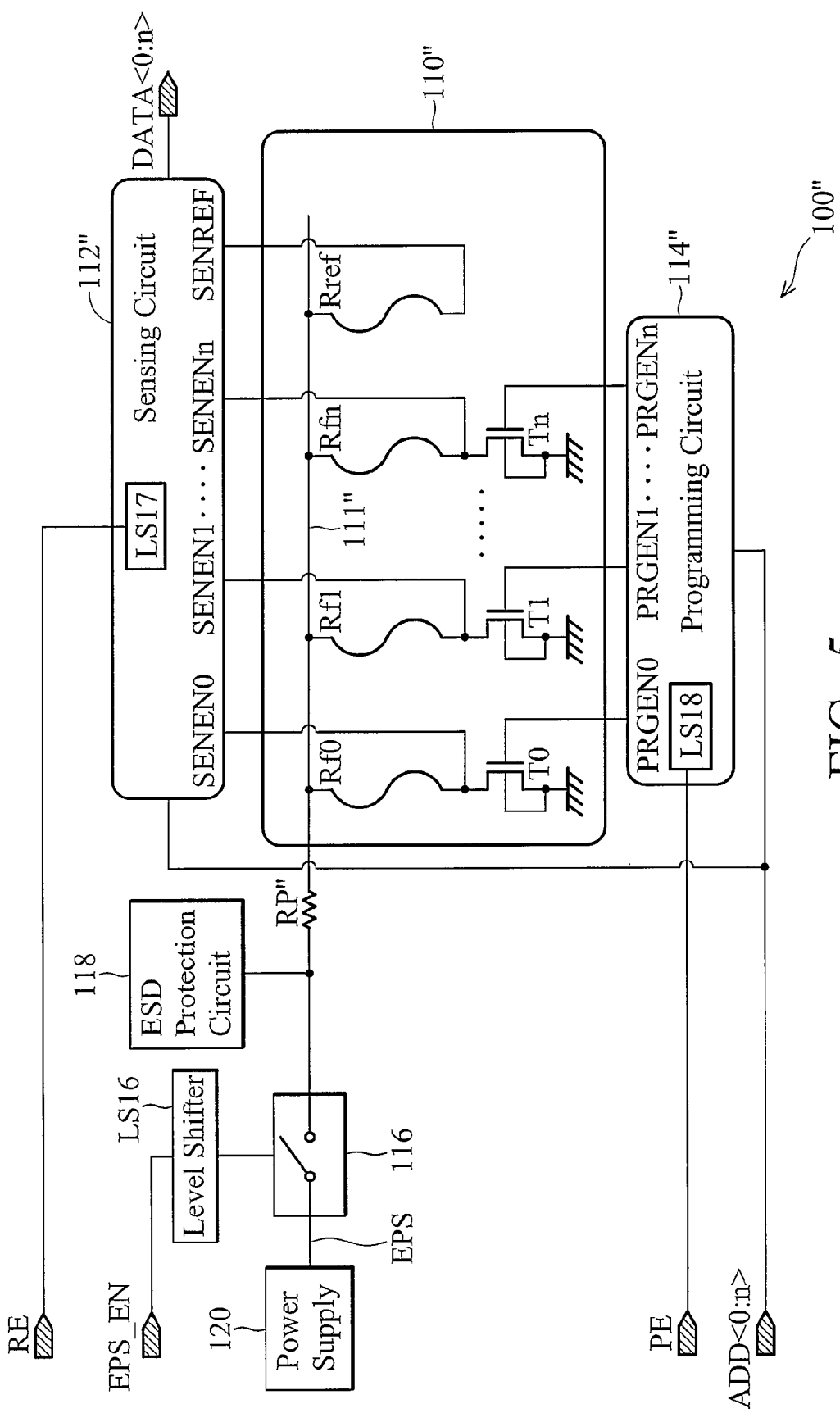
FIG. 5 shows another embodiment of a memory circuit.

FIG. 5 shows another embodiment of a memory circuit. As shown, the memory circuit 100" comprises an electrical programmable unit 110", a sensing circuit 112", a programming circuit 114", a switching unit 116, a level shifter LS16, an electrostatic discharge (ESD) protection circuit 118, a power supply 120 and a resistor RP". For example, the memory circuit 100" can be a nonvolatile memory, an electrical programmable memory or one time programmable (OTP) read only memory, but it is not limited thereto. The power supply 120 provides an external programming voltage EPS, such as a fuse source or a power voltage, for the electrical programmable unit 110".

The electrical programmable unit 110" comprises a plurality of fuse elements each comprising a fuse (i.e. Rf0, Rf1 or Rfn) to be blown and a NMOS transistor (i.e. T0, T1 or Tn) serving as a current source. The fuses Rf0~Rfn, for example, can be salicide polysilicon resistors, and the MOS transistors T0~Tn can be thick gate or thin gate devices. A reference fuse Rref is also connected to the sensing circuit 112", to differentiate the non-blown or blown fuse, and the fuses Rf0~Rfn and Rref are connected to an external programming voltage EPS through a source bus 111" and the resistor RP". The electrical programmable unit 110", for example, can be a nonvolatile and electrical programmable unit, such as an e-fuse bank, a flash memory, one time programmable unit but it is not limited thereto.

The sensing circuit 112" and the programming circuit 114" are similar to the sensing circuit 112 and the programming circuit 114 shown in FIGS. 2 and 3, differing only in that the level shifters LS17 and LS18 capable of setting a predetermined logic level to output terminals thereof such that the sensor SA0~SAn in the sensing circuit 112" and the drivers in the programming circuit 114" are disabled when the core power voltage VDD_CORE is not ready during power up.

For example, the level shifter LS 17 is coupled between the read enabling signal RE and the AND gates AG00~AG0n in the sensing circuit 112", to set input terminals of the AND gate AG00~AG0n to a low logic state such that the sensors SA0~SAn in the sensing circuit 112" are disabled when the core power voltage VDD_CORE is not ready during power-up, thereby preventing false sensing caused by power on sequence. Similarly, the level shifter LS 18 is coupled between the programming enabling signal PE and the AND gates AG10~AG1n in the programming circuit 114", to set input terminals of the AND gate AG10~AG1n to a low logic state such that the programming circuit 114" are disabled when the core power voltage VDD_CORE is not ready during power-up, thereby false programming caused by power on sequence.

On the contrary, when the I/O power voltage VDD_IO and the core power voltage VDD_CORE are both ready, the level shifters LS16~LS18 shift the external programming voltage enabling signal ESP_EN, the read enabling signal RE and the programming enabling signal PE to I/O power domain signals from core power domain signals, thereby controlling the switching unit 116, the sensors SA0~SAn in the sensing circuit 112" and the AND gates AG10~AG1n in the programming circuit 114" respectively.

It should be noted that as the NMOS transistors T0~Tn in the electrical programmable unit 110" are implemented by thick gate device (I/O devices), a set of level shifters LS17 are required to shift the address<0:n> and the read enabling signal RE in the sensing circuit 112". Similarly, a set of level shifters LS18 are required to shift the address<0:n> and the programming enabling signal PE in the programming circuit 114".

The switching unit 116 is coupled between the external programming voltage EPS and resistor RP" to selectively disconnect the external programming voltage EPS and the source bus 111" according to output of the level shifter LS16. The switching unit 16, for example, can comprise active elements, such as MOS transistors, bipolar junction transistors (BJTs), junction field-effect transistors (JFETs) and the like but is not limited thereto.

The level shifter LS16 is coupled between the external programming voltage enabling signal EPS_EN to control the switching unit 116, thereby disconnecting the external programming voltage EPS to the programmable unit 110 selectively. For example, when the I/O power voltage VDD_IO and the core power voltage VDD_CORE are ready, the level shifter LS16 shifts the voltage level of the external programming voltage enabling signal EPS_EN to an I/O power domain signal from a core power domain signal, thereby controlling the switching unit 116 to connect the external programming voltage EPS to the programmable unit 110 for programming or sensing the programmable unit 110. On the contrary, when the core power voltage VDD_CORE is not ready during power-up, the level shifter LS16 sets a control terminal of the switching unit 116 to a predetermined logic level such that the switching unit 116 is turned off and the source bus 111 in the programmable unit 110 is disconnected from the external programming voltage EPS thereby preventing false programming.

The level shifters LS16~LS18, for example, can set a predetermined logic level to output terminals thereof by AC coupling, a control signal from an external circuit, discharging by a resistive element or a combination thereof. The ESD protection circuit 118 is connected to the switching unit 116 and the resistor RP'' to prevent from electrostatic discharge (ESD) events.

Figure 6:
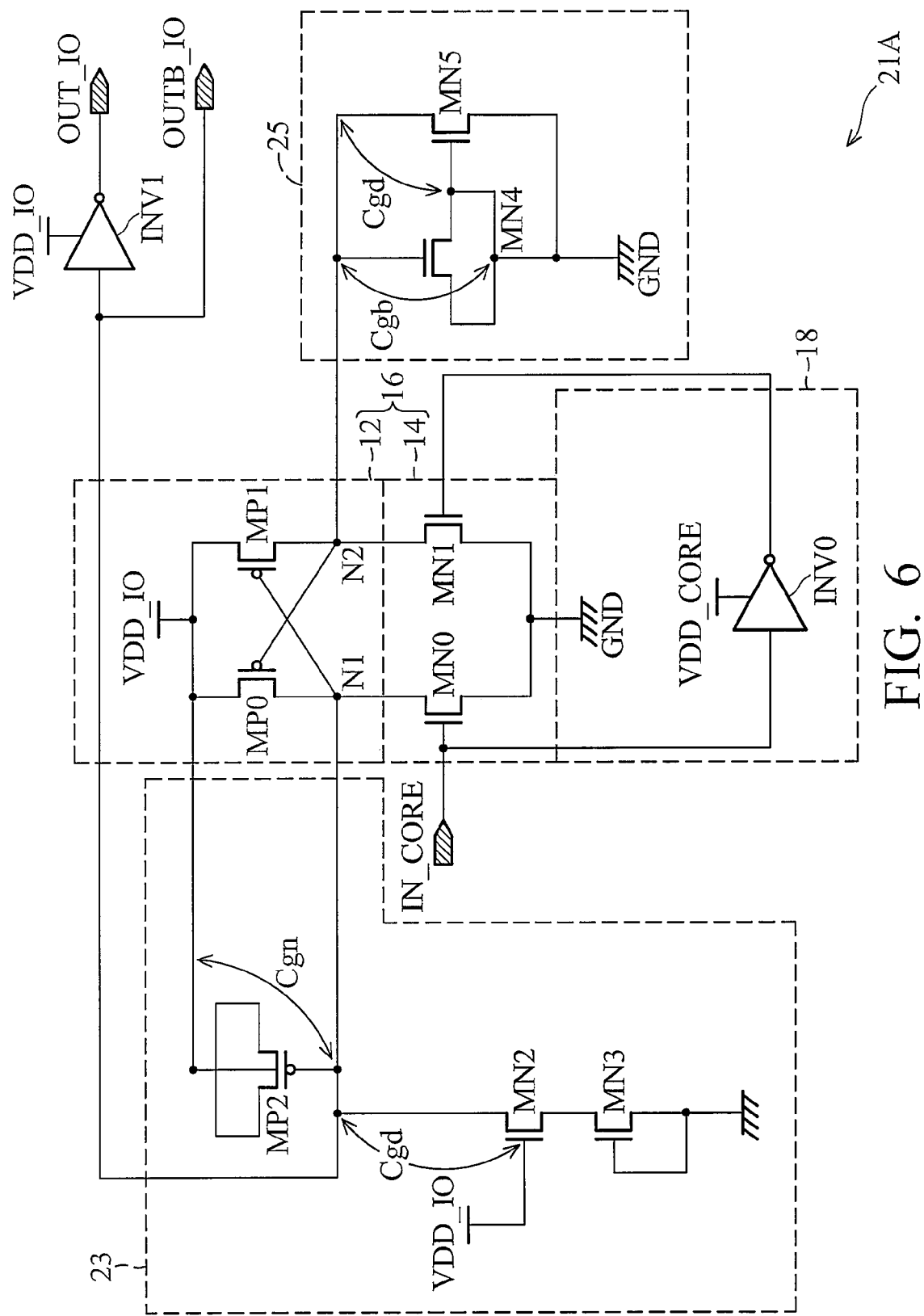
FIG. 6 shows an embodiment of a level shifter.

FIG. 6 shows an embodiment of a level shifter. As shown, a level shifter 21A generates output signals OUT_IO and OUTB_IO according to an input signal IN_CORE and comprises a first logic unit 16, a second logic unit 18, two drivers 23 and 25 and an inverter INV1. The first logic unit 16 is powered by the I/O power voltage VDD_IO and a second logic unit 18 is powered by the core power voltage VDD_CORE. For example, the first logic unit 18 can comprise a latch unit 12 having two cross-coupled PMOS transistors MP0 and MP1 and a differential pair 14 having two NMOS transistors MN0 and MN1, and the second logic unit comprises an inverter INV0. In some embodiments, the latch unit 12 can also comprise two cross-coupled inverters. The inverter INV0 powered by the core power voltage VDD_CORE converts the input signal IN_CORE to an inverse signal INB_CORE. In one embodiment, transistors in the latch unit 12 are implemented by thin gate devices while other transistors in the level shifter 21A are implemented by thick gate devices.

As the input signal IN_CORE goes high, the inverse signal INB_CORE goes low and the NMOS transistors MN0 and MN1 are turned on and off respectively. As NMOS transistor MN0 is turned on, the gate terminal of the PMOS transistor MP1 is pulled to the ground voltage GND and the PMOS transistor MP1 is then turned on. Thus, the output signals OUT_IO and OUTB_IB go high and low respectively. In this case, the nodes N1 and N2 can be regarded as output terminals outputting the output signals OUT_IO and OUTB_IB.

The first driver 23 is coupled between the I/O power voltage VDD_IO and the node N1, matching the voltage at the node N1 with the I/O power voltage VDD_IO when the core power voltage VDD_CORE is not ready, and the second driver 25 is coupled between the ground voltage GND and the node N2, pulling the voltage at the node N2 low (or remaining low) when the core power voltage VDD_CORE is not ready. The first driver 23 is implemented by the PMOS transistor MP2 and NMOS transistors MN2 and MN3 and the second driver 25 is implemented by the NMOS transistors MN4 and MN5.

The PMOS transistor MP2 comprises drain and source terminals coupled to the I/O power voltage VDD_IO and a gate terminal coupled to the node N1, i.e., the PMOS transistor MP2 is connected as a capacitor. The NMOS transistor MN2 comprises a drain terminal coupled to the node N1, a gate coupled to the I/O power voltage VDD_IO and a source terminal. In some embodiments, the level shifter 21A can comprise the first driver 23 without the second driver 25.

The NMOS transistor MN3 comprises a drain terminal coupled to the source terminal of the NMOS transistor MN2, and a gate terminal and a source terminal both coupled to the ground voltage GND. The NMOS transistor NM4 comprises a gate terminal coupled to the node N2, and a source terminal and a drain terminal both coupled to the ground voltage GND, i.e., the NMOS transistor MN4 is connected as a capacitor. The NMOS transistor MN5 comprises a drain terminal coupled to the node N2, and a gate terminal and a source terminal both coupled to the ground voltage GND. Namely, the NMOS transistors MN4 and MN5 can be regarded as decoupling capacitors.

Due to presence of parasitical capacitors Cgd and/or Cgb, the voltage level at the node N1 follows the I/O power voltage VDD_IO, while the voltage level at the node N2 remains low because of the decoupling capacitors, i.e., the NMOS transistors MN4 and MN5. Hence, the output signals OUTB_IO and OUT_IO are set at high and low respectively when the core power voltage VDD_CORE is not ready during power-up. Namely, because output terminals of the level shifter 21A can be set to predetermined logic states when the core power voltage VDD_CORE is not ready during power-up, the level shifter 21A can be used to implement the shifter levels LS16, LS17 and LS18 in FIG. 5.

For example, when the core power voltage VDD_CORE is not ready during power-up, the level shifter LS16 outputs the output signal OUTB_IO with a high voltage level and/or the output signal OUT_IO with a low voltage level to the switching unit 116 such that the external programming voltage EPS is disconnected from the programmable unit 110 thereby preventing unexpected or false programming. Similarly, the level shifter LS17 outputs the output signal OUT_IO with a low voltage level to the gates AG00~AG0n in the sensing circuit 112'' when the core power voltage VDD_CORE is not ready during power-up, such that the sensors SA0~SAn in the sensing circuit 112'' are disabled. Furthermore, the level shifter LS18 outputs the output signal OUT_IO with a low voltage level to the gates AG10~AG1n in the programming circuit 114'' when the core power voltage VDD_CORE is not ready during power-up, such that the programming circuit 114'' is disabled.

In some embodiments, the first driver 23 can comprise the NMOS transistors MN2 and MN3 without the PMOS transistor MP2. In some embodiments, the first driver 23 can comprise the PMOS transistor MP2 without the NMOS transistors MN2 and MN3. In some embodiments, the second driver 25 can comprise the NMOS transistors MN4 without the NMOS transistor MN5. In some embodiments, the second driver 25 can comprise the NMOS transistors MN5 without the NMOS transistor MN4.

Figure 7A:
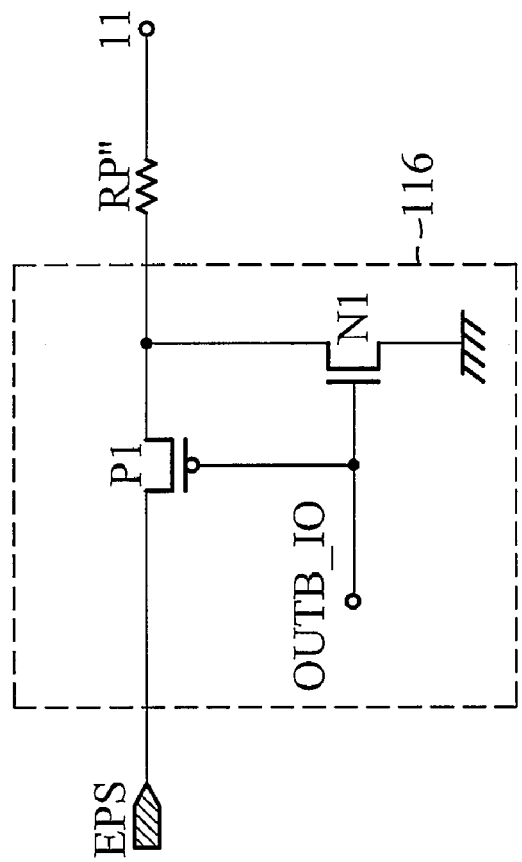
FIG. 7A shows an embodiment of a switching unit.

FIG. 7A shows an embodiment of a switching unit. As shown, the switching unit 116 comprises a PMOS transistor P1 coupled between the external programming voltage EPS and the resistor RP'' and an NMOS transistor N1 coupled between the resistor RP'' and a ground, in which control terminals of the transistors P1 and N1 are connected together to an output terminal of the level shifter LS16. As the output signal OUTB_IO is high voltage level when the core power voltage VDD_CORE is not ready during power-up, the PMOS transistor P1 is turned off and the NMOS transistor N1 is turned on. Thus, the external programming voltage EPS is disconnected from the source bus 111'' of the programmable unit 110'' and is discharged to the ground. Namely, the level shifter LS16 outputs the output signal OUTB_IO to turn off the switching unit 116 regardless of the external programming voltage enabling signal EPS_EN during power-up. As the external programming voltage EPS is disconnected from the source bus 111'' of the programmable unit 110'' when the core power voltage VDD_CORE is not ready during power-up, unexpected or false programming can be prevented.

When the I/O power voltage VDD_IO and the core power voltage VDD_CORE are ready, the level shifter LS16 outputs the output signals OUT_IO and OUTB_IO to control the switching unit 116 according to the external programming voltage enabling signal EPS_EN. Namely, the switching unit 116 selectively connects the external programming source EPS to the source bus 111" in the programmable unit 110" according to the external programming voltage enabling signal EPS_EN after power-up. For example, when the output signal OUTB_IO is low voltage level, the PMOS transistor P1 is turned on and the NMOS transistor N1 is turned off. Thus, the external programming voltage EPS is connected to the source bus 111" of the programmable unit 110" for programming or sensing the programmable unit 110".

The NMOS transistor N1 is not necessary if the sensing circuit 112" does not require the node to be pulled to the ground when the PMOS transistor P1 is turned off. That is, in some embodiments, the NMOS transistor N1 need not be implemented, and the implementation of only the PMOS transistor P1 can suffice.

Figure 7B:
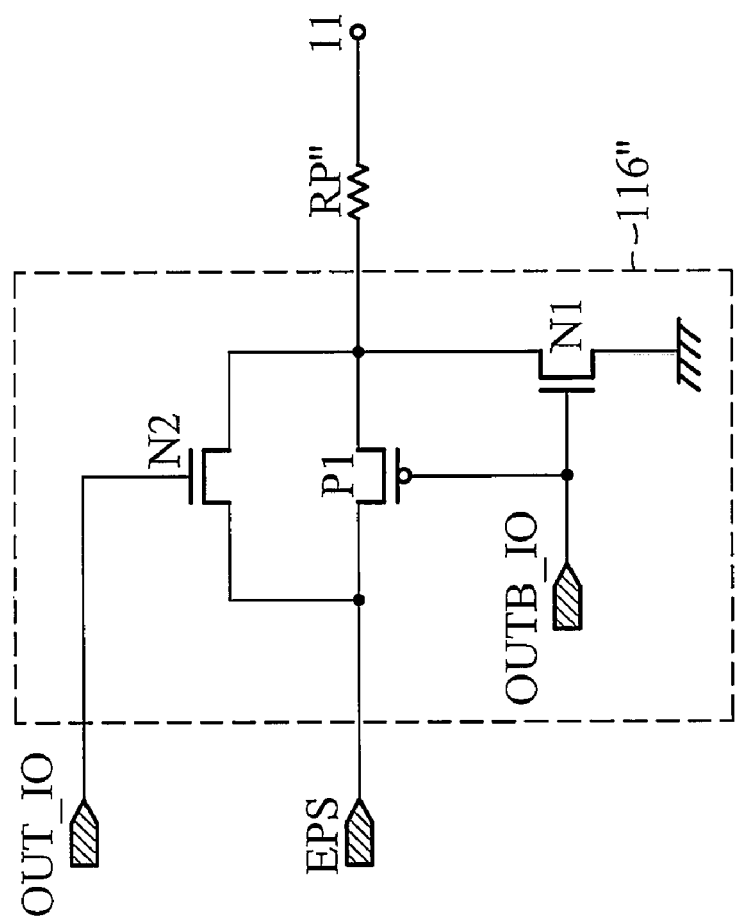
FIG. 7B shows another embodiment of a switching unit.

FIG. 7B shows another embodiment of a switching unit. As shown, the switching unit 116" is similar to the switching unit 116 shown in FIG. 6A, differing only in that an NMOS N2 is coupled between the external programming voltage EPS and the resistor RP". As output signals OUTB_IO and OUT_IO are set to a high voltage level and a low voltage level respectively when the core power voltage VDD_CORE is not ready during power-up, the PMOS transistor P1 and the NMOS transistor N2 are turned off and the NMOS transistor N1 is turned on. Thus, the external programming voltage EPS is disconnected from the source bus 111" of the programmable unit 110" and is discharged to the ground. As the external programming voltage EPS is disconnected from the source bus 111" of the programmable unit 110" when the core power voltage VDD_CORE is not ready during power-up, unexpected or false programming can be prevented. The NMOS transistor N1 is not necessary if the sensing circuit 112" does not require the node to be pulled to the ground when the PMOS transistor P1 and the NMOS transistor N2 are turned off. That is, in some embodiments, the NMOS transistor N1 need not be implemented, and the implementation of only the PMOS transistor P1 and the NMOS transistor N2 can suffice.

FIG. 8 shows a simulation of the memory circuit shown in FIG. 5. As shown, the voltage level VBUS on the source bus 111" in the programmable unit 110" remains low before the core power voltage VDD_CORE is ready, because the output signal OUTB_IO follows the I/O power voltage VDD_IO to disconnect the external programming voltage EPS and the source bus 111" when the core power voltage VDD_CORE is not ready during power-up. Thus, unexpected or false programming can be prevented.

Figure 9:
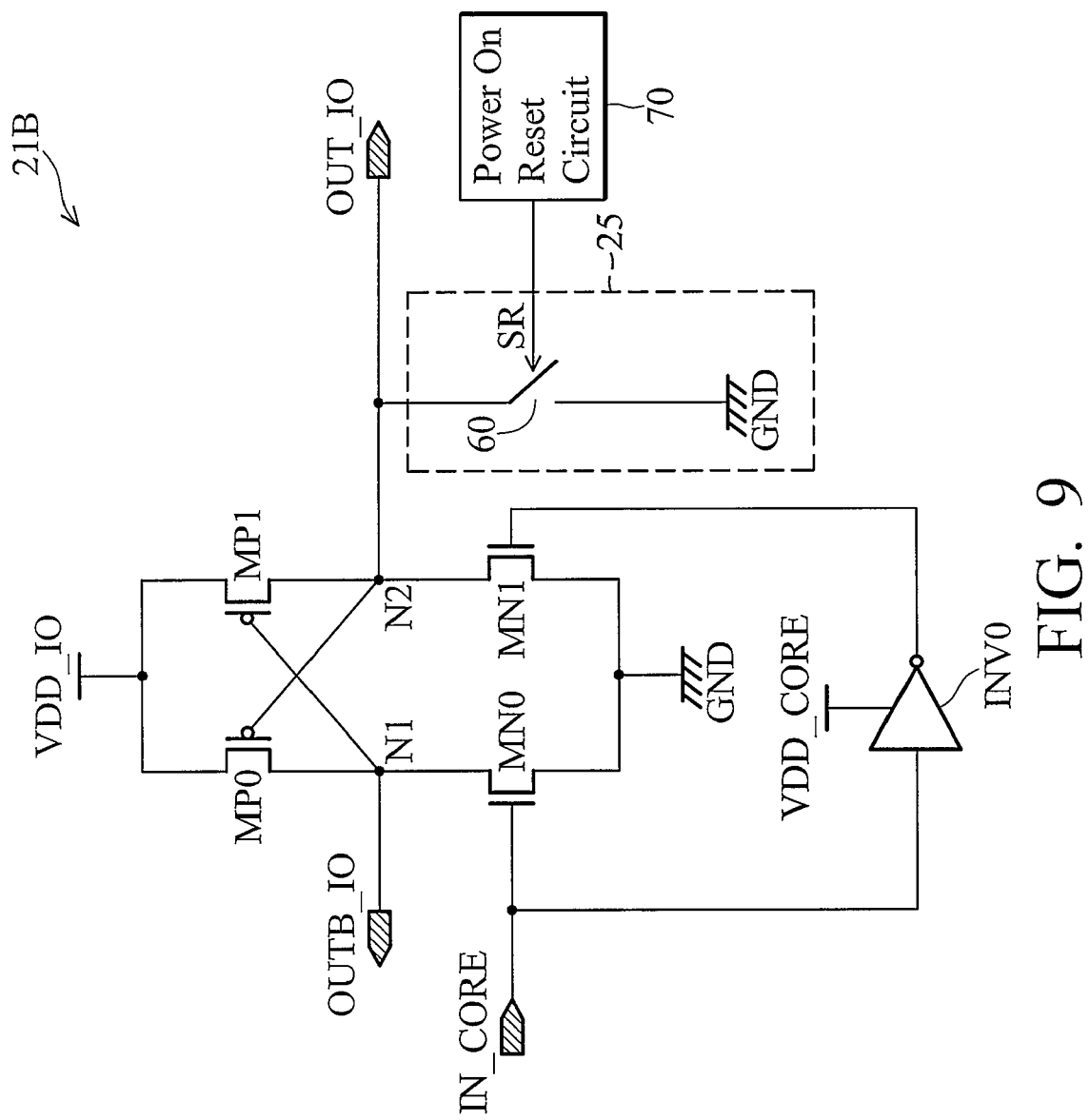
FIG. 9 shows another embodiment of a level shifter.

FIG. 9 shows another embodiment of a level shifter. As shown, the level shifter 21B is similar to the level shifter 21A shown in FIG. 6, differing only in that the first driver 23 is omitted and the second driver 25 is implemented by a switching element 60. In one embodiment, transistors in the inverter INV0 are implemented by thin gate devices while other transistors in the level shifter 21B are implemented by thick gate devices. The switching element 60 is coupled between the node N2 and the ground voltage GND and controlled by an external power on reset circuit 70. The external power on reset circuit 70 generates a control signal SR to control the switching element 60, such that the voltage level at the node N2 can be pulled low when the core power voltage VDD_CORE is not ready during power-up. As the node N2 is pulled low by the switching element 60, the PMOS transistor MP0 is turned on and the node N1 is pulled to the I/O power voltage VDD_IO. Namely, the output signals OUTB_IO and OUT_IO are set to high and low respectively when the core power voltage VDD_CORE is not ready.

When the core power voltage VDD_CORE is ready, the power on reset circuit 70 turns off the switching element 60 by the control signal SR, such that the inverter INV0 with core power voltage VDD_CORE outputs an inverse signal and regains control of this level shifter 21B. In some embodiments, the switching element 60 can be implemented by an active element, such as MOS transistors, bipolar junction transistors (BJTs), junction field effect transistor (JFETs) or combination thereof.

Figure 10:
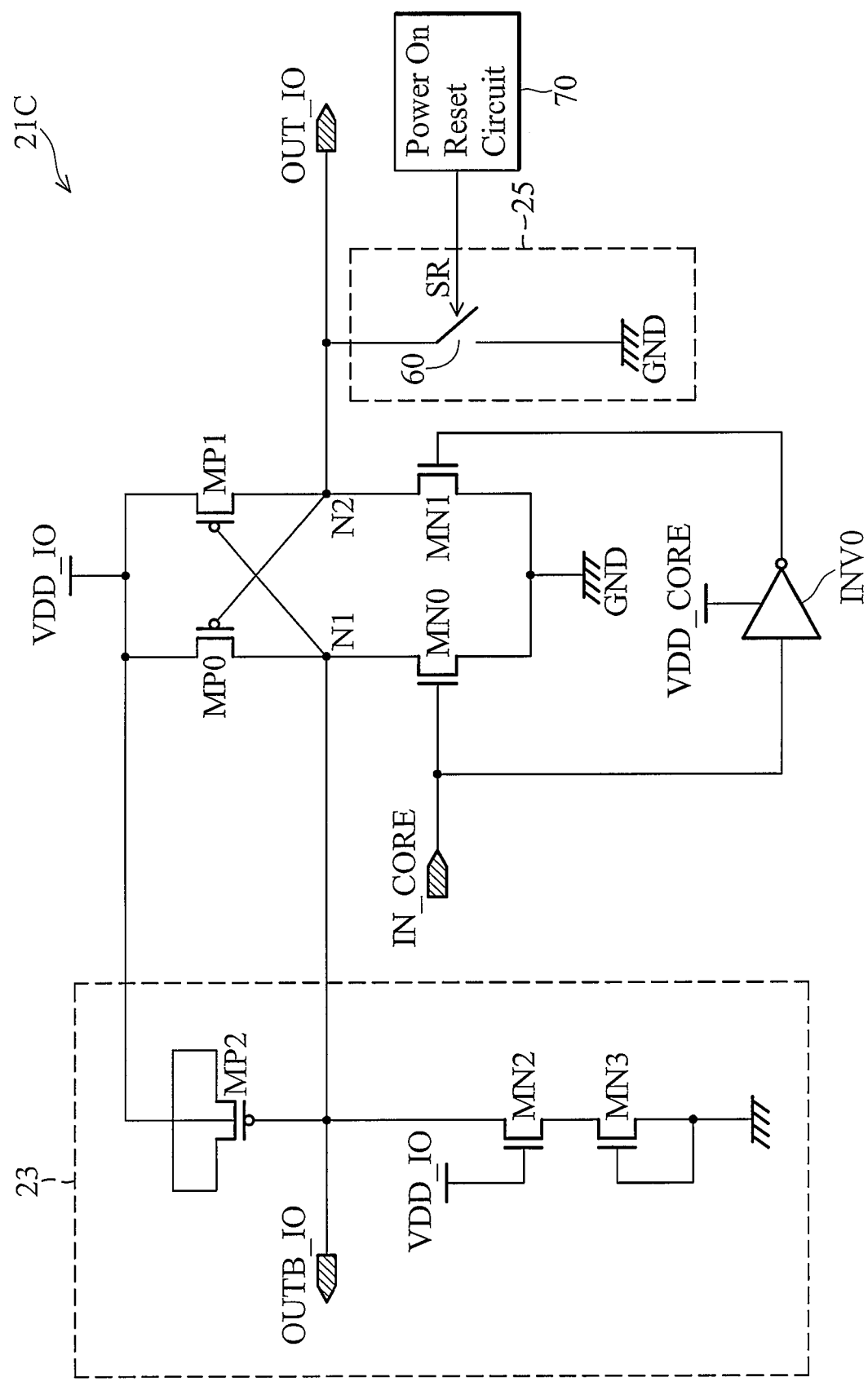
FIG. 10 shows another embodiment of a level shifter.

FIG. 10 shows another embodiment of a level shifter. As shown, the level shifter 21C is similar to the level shifter 21A shown in FIG. 6, differing only in that the second driver 25 is implemented by the switching element 60. In one embodiment, transistors in the inverter INV0 are implemented by thin gate devices while other transistors in the level shifter 21C are implemented by thick gate devices. During power-up, when the core power voltage VDD_CORE is not ready, the voltage level at the node N1 follows the I/O power voltage VDD_IO because of AC coupling caused by the parasitical capacitors Cgd or Cgb of the MOS transistors MP2, MN2 or MN3, and the voltage level at the node N2 is pulled low by the switching element 60. Namely, the output signals OUTB_IO and OUT_IO are set at high and low respectively when the core power voltage VDD_CORE is not ready during power-up. When the core power voltage VDD_CORE is ready, the external power on reset circuit 70 turns off the switching element 60 by the control signal SR, such that the inverter INV0 with core power voltage VDD_CORE outputs an inverse signal and regains control of this level shifter 21C.

Figure 11:
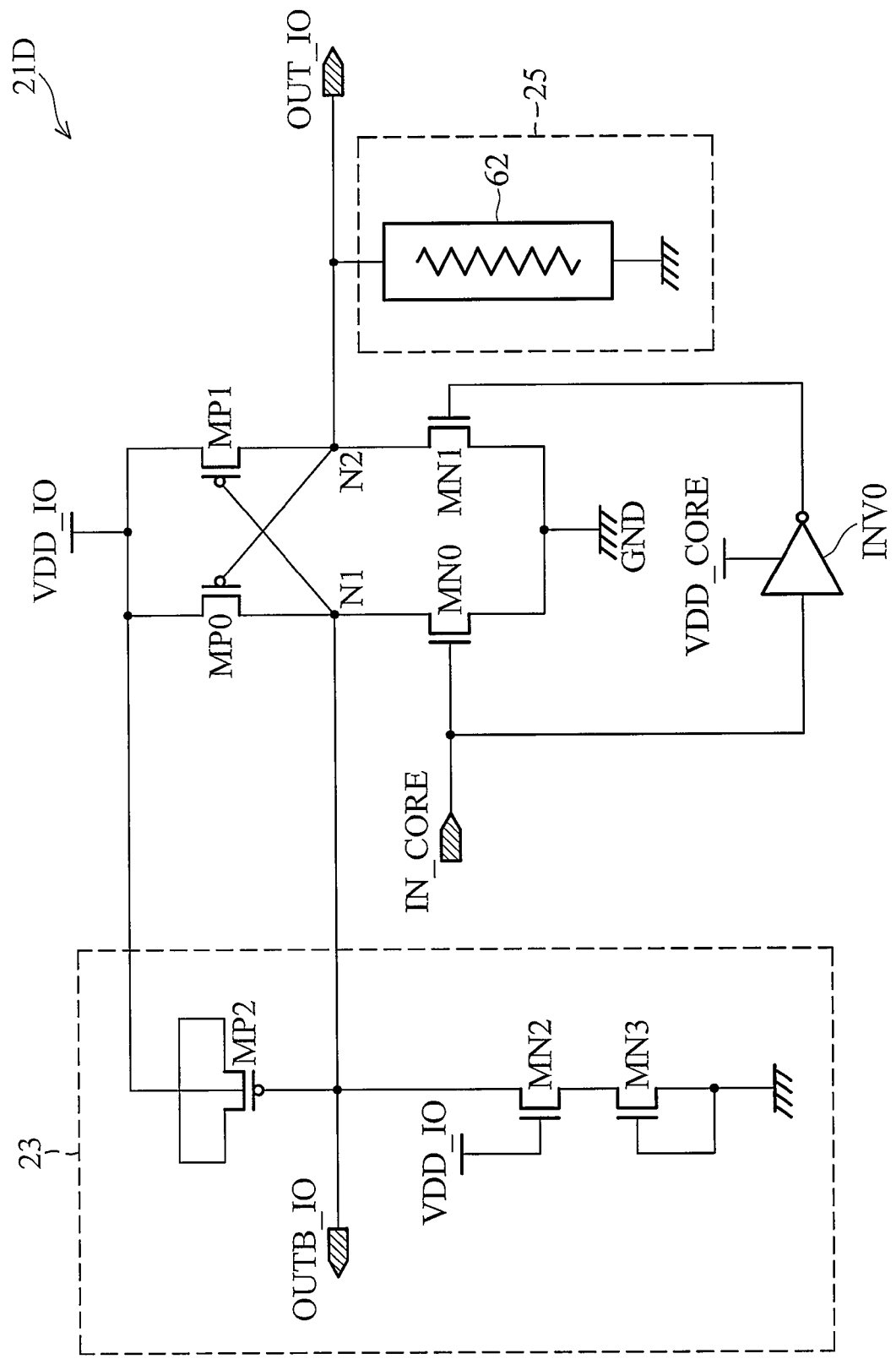
FIG. 11 shows another embodiment of a level shifter.

FIG. 11 shows another embodiment of a level shifter. As shown, the level shifter 21D is similar to the level shifter 21A shown in FIG. 6, differing only in that the second driver 25 is implemented by a resistive element 62 pulling low the voltage level of the node N2 slowly. During power-up, when the core power voltage VDD_CORE is not ready, the voltage level at the node N1 follows the I/O power voltage VDD_IO because of AC coupling caused by the parasitical capacitors Cgd or Cgb of the MOS transistors MP2, MN2 or MN3 while the voltage level at the node N2 is pulled low by the resistive element 62 slowly. Namely, the output signals OUTB_IO and OUT_IO are set at high and low respectively when the core power voltage VDD_CORE is not ready during power-up. For example, if the resistive element 62 has a sufficient resistance, it can also be regarded as a high impedance when the core power voltage VDD_CORE is ready. Hence, the inverter INV0 with core power voltage VDD_CORE outputs an inverse signal and regains control of level shifter 21D when the core power voltage VDD_CORE is ready.

Figures 12A, 12B:
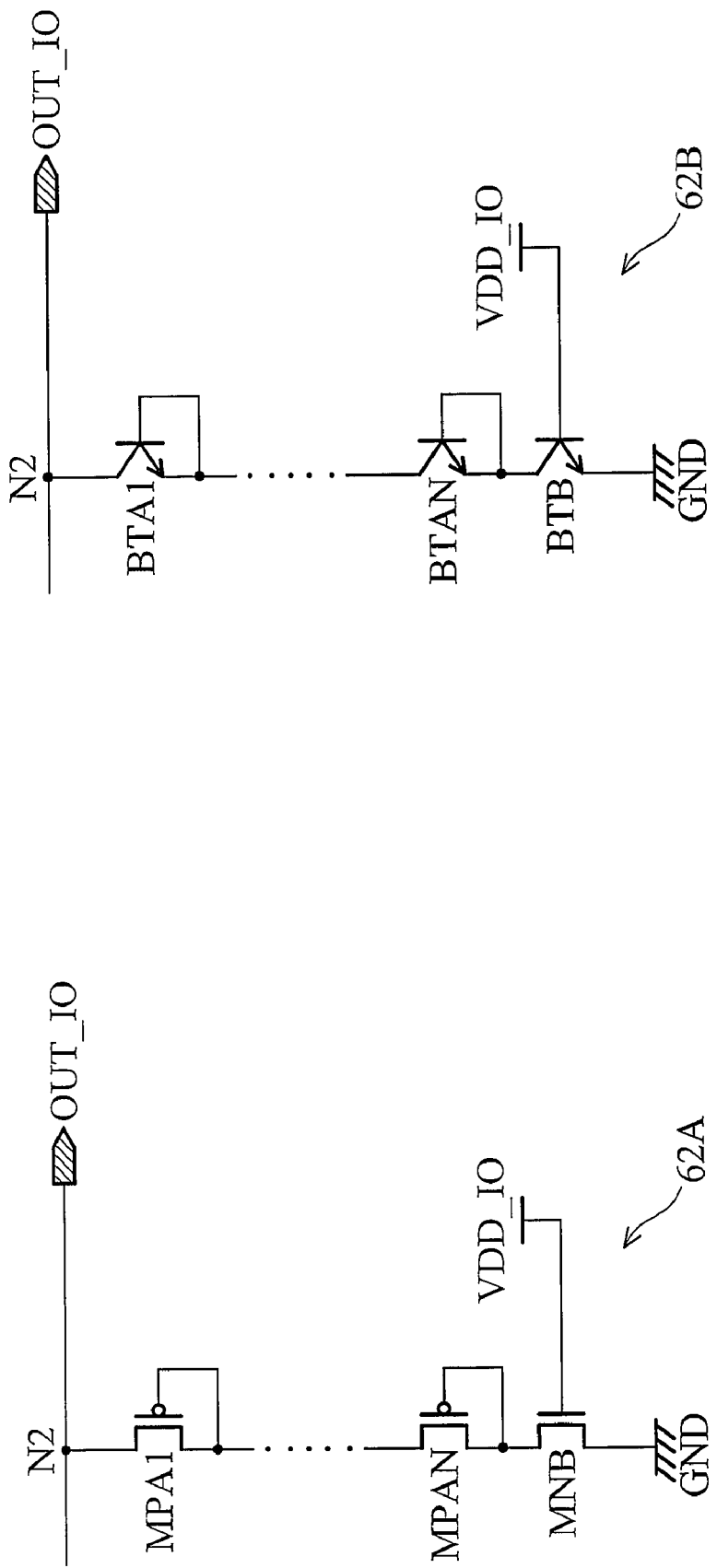
FIG. 12A shows an embodiment of a resistive element.
FIG. 12B shows an embodiment of a resistive element.

FIG. 12A shows an embodiment of a resistive element. As shown, a resistive element 62A is coupled between the node N2 and the ground voltage GND and comprises N PMOS transistors MPA1~MPAN connected in series and a NMOS transistor MNB coupled between the NMOS transistors MPA1~MPAN and the ground voltage GND. The NMOS transistors MPA1~MPAN are each connected as a diode form, i.e., gate terminal is coupled to the source terminal thereof. When the I/O power voltage VDD_IO is ready during power-up, the NMOS transistor MNB is turned on, such the voltage level at the node N2 is pulled low slowly. Hence, when the I/O power voltage VDD_IO is ready prior to the core power voltage VDD_CORE, the output signal OUTB_IO is pulled high by the first driver 23 and the output signal OUT_IO is pulled low slowly by the resistive element 62A.

FIG. 12B shows another embodiment of a resistive element. As shown, the resistive element 62B is similar to the resistive element 62A shown in FIG. 12A, differing only in that the PMOS transistors MPA1~MPAN are replaced by bipolar junction transistors BTA1~BTAN. Operations of the resistive element 62B are similar to those of the resistive element 62A shown in FIG. 12A, and thus are omitted for simplification.

Figure 12D:
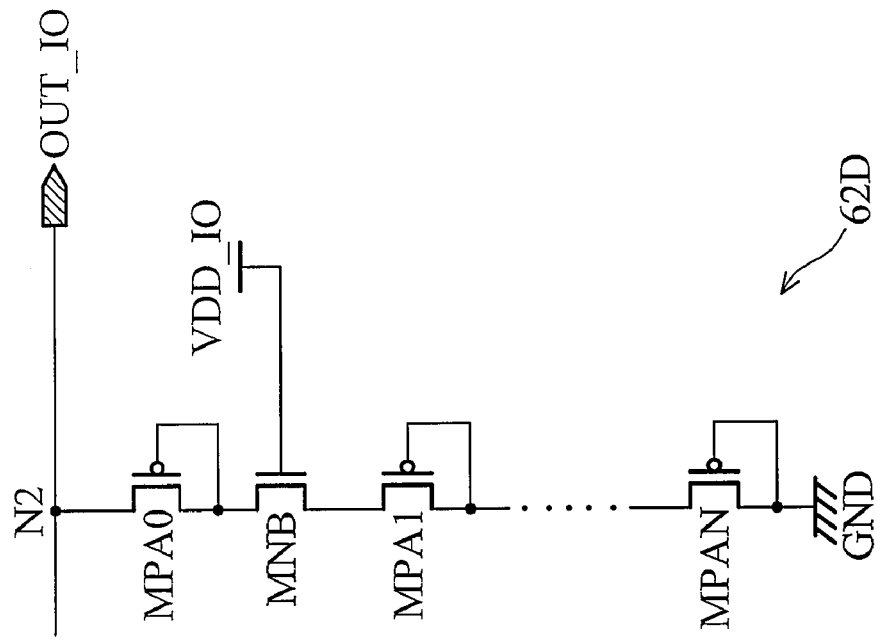
FIG. 12D shows an embodiment of a resistive element.
Figure 12C:
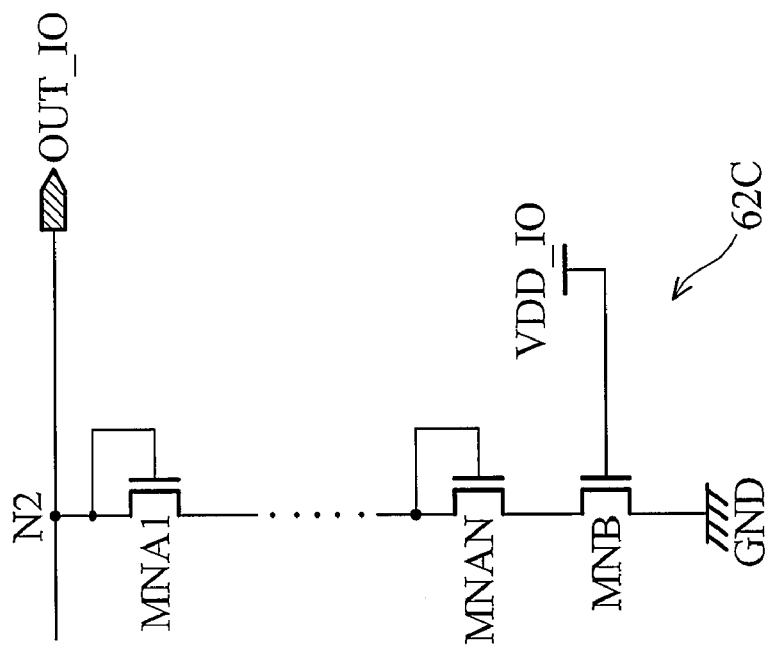
FIG. 12C shows an embodiment of a resistive element.

FIG. 12C shows another embodiment of a resistive element. As shown, the resistive element 62C is similar to the resistive element 62A shown in FIG. 12A, differing only in that the PMOS transistors MPA1~MPAN are replaced by NMOS transistors MNA1~MNAN. The NMOS transistors MNA1~MNAN are each connected as a diode form, i.e., gate terminal coupled to the drain terminal thereof. Operations of the resistive element 62C are similar to those of the resistive element 62A shown in FIG. 12A, and thus are omitted for simplification.

FIG. 12D shows another embodiment of a resistive element. As shown, the resistive element 62D is similar to the resistive element 62A shown in FIG. 12A, differing only in that the NMOS transistor MNB is coupled between PMOS transistors MPA1~MPAN and MPA0. Operations of the resistive element 62D are similar to those of the resistive element 62A shown in FIG. 12A, and thus are omitted for simplification.

In some embodiments, the level shifters LS16, LS17 and L18 can be selectively omitted. For example, when the NMOS transistors (i.e. T0~Tn) in the programmable unit 110 can be implemented by thin gate devices, and thus, only the core power voltage VDD_CORE is needed for the sensing circuit 112" and the programming circuit 114", and thus, the level shifters LS17 and LS18 can be omitted. Alternately, when the NMOS transistors (i.e. T0~Tn) in the programmable unit 110 are implemented by thick gate devices, the level shifters in the sensing circuit 112" and the programming circuit 114" can all be implemented by the level shifters 21A, 21B, 21C or 21D as shown in FIG. 6, 9, 10 or 11. Alternately, the levels shifters in the sensing circuit 112" and the programming circuit 114" can all be implemented by the level shifters 21A, 21B, 21C or 21D as shown in FIG. 6, 9, 10 or 11, but the switching unit 116 and the level shifter LS16 are omitted.

Because the memory circuit in the embodiments of the invention can disconnect the external programming voltage from the source bus in the programmable unit and disable the programming circuit and the sensing circuit when the core power voltage is not ready during power-up, unexpected or false programming caused by power-up sequence can be prevented.

While the invention has been described by way of example and in terms of preferred embodiment, it is to be understood that the invention is not limited thereto. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A memory circuit, comprising:
   a programmable unit, comprising:
   a plurality of programmable elements; and
   a source bus coupled between an external programming voltage and the programmable elements;
   a switching unit coupled between the external programming voltage and the source bus, the switching unit comprising a control terminal; and
   a level shifter, shifting a voltage level of an enabling signal to a first power voltage from a second power voltage lower than the external programming voltage, wherein when the second power voltage is not ready during power up, the level shifter sets the control terminal of the switching unit to a predetermined logic level such that the switching unit is turned off and the source bus is disconnected from the external programming voltage thereby preventing false programming.

2. The memory circuit as claimed in claim 1, wherein the programmable elements each comprise a fuse.

3. The memory circuit as claimed in claim 1, wherein the memory circuit is a nonvolatile memory.

4. The memory circuit as claimed in claim 1, wherein memory circuit is an electrical programmable memory.

5. The memory circuit as claimed in claim 1, wherein the programmable unit is a flash memory.

6. The memory circuit as claimed in claim 1, wherein the first power voltage exceeds the external programming voltage.

7. The memory circuit as claimed in claim 1, wherein the level shifter shifts the voltage level of the enabling signal to the first power voltage from the second power voltage when the first and second power voltages are ready.

8. The memory circuit as claimed in claim 7, wherein the level shifter sets the control terminal of the switching unit to the predetermined logic level by AC coupling when the second power voltage is not ready during power up.

9. The memory circuit as claimed in claim 7, wherein the level shifter sets the control terminal of the switching unit to the predetermined logic level according to a control signal from an external circuit when the second power voltage is not ready during power up.

10. The memory circuit as claimed in claim 7, wherein the level shifter sets the control terminal of the switching unit to the predetermined logic level by AC coupling and a control signal from an external circuit when the second power voltage is not ready during power up.

11. A memory circuit, comprising:
    a power supply, providing an external programming voltage; and
    a programmable unit, comprising:
    a plurality of programmable elements coupled to a source bus; and;
    a programming circuit programming the programmable elements, the programming circuit comprising a plurality of drivers coupled to the programmable elements and a first level shifter, the first level shifter being powered by at least a first power voltage lower than the external programming voltage, wherein the first level shifter set a first predetermined logic level to an output terminal thereof such that the drivers are disabled when the first power voltage is not ready during power up, the first level shifter thereby preventing false programming.

12. The memory circuit as claimed in claim 11, further comprising a sensing circuit reading the programmable elements, the sensing circuit comprising a plurality of sensors coupled to the programmable elements and a second level shifter, wherein the second level shifter sets a second predetermined logic level to an output terminal thereof such that the sensors in the sensing circuit are disabled when the first power voltage is not ready during power up.

13. The memory circuit as claimed in claim 12, further comprising:
- a switching unit connected between the external programming voltage and the source bus, the switching unit comprising a control terminal; and
- a third level shifter, setting the control terminal of the switching unit to a third predetermined logic level such that the source bus is disconnected from the external programming voltage thereby preventing false programming when the first power voltage is not ready during power up.

14. The memory circuit as claimed in claim 13, wherein each of the programmable elements comprises a fuse and a transistor connected in series between the source bus and a ground voltage.

15. The memory circuit as claimed in claim 13, wherein the first, second and third level shifters are powered by the first power voltage and a second power voltage exceeding the external programming voltage, the first, second and third level shifters shifting a voltage level of an enabling signal to the second power voltage from the first power voltage when the first and second power voltages are ready.

16. A malfunction protection method for a memory circuit comprising a plurality of programmable elements, a programming circuit and a sensing circuit, the method comprising:
- disposing a switching unit between the programmable elements and an external programming voltage;
- disposing a first level shifter to couple to a control terminal of the switching unit, wherein the first level shifter is powered by first and second power voltages, the second power voltage is lower than the external programming voltage and the first power voltage exceeds the external programming voltage; and
- setting the control terminal of the switching unit to a first predetermined logic level such that the switching unit is turned off and the programmable elements are disconnected from the external programming voltage when the second power voltage is not ready during power-up.

17. The method as claimed in claim 16, further comprising:
- disposing a second level shifter between drivers in the programming circuit and a programming enabling signal,
- setting a second predetermined logic level to an output terminal of the second level shifter such that the drivers in the programming circuit are disabled when the second power voltage is not ready during power-up.

18. The method as claimed in claim 17, further comprising:
- disposing a third level shifter between sensors in the programming circuit and a reading enabling signal,
- setting a third predetermined logic level to an output terminal of the third level shifter such that the sensors in the sensing circuit are disabled when the second power voltage is not ready during power-up.

19. The method as claimed in claim 18, wherein the first, second and third level shifter set the first, second and third predetermined logic levels to the output terminals thereof by AC coupling or a control signal from an external circuit.

* * * * *